(12) United States Patent
Berthold et al.

(10) Patent No.: US 8,076,228 B2
(45) Date of Patent: Dec. 13, 2011

(54) LOW NOISE TRANSISTOR AND METHOD OF MAKING SAME

(75) Inventors: Adrian Berthold, Munich (DE); Michael Bianco, Munich (DE); Reinhard Mahnkopf, Oberhaching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/699,202

(22) Filed: Jan. 29, 2007

(65) Prior Publication Data

US 2008/0179695 A1   Jul. 31, 2008

(51) Int. Cl.
*H01L 21/38* (2006.01)
*H01L 21/00* (2006.01)

(52) U.S. Cl. .................................... 438/565; 257/612

(58) Field of Classification Search .............. 438/216, 438/261, 528, 565; 257/607–612, E21.466–E21.469
See application file for complete search history.

(56) References Cited

U.S. PATENT DOCUMENTS

| | | | |
|---|---|---|---|
| 4,748,131 A | 5/1988 | Zietlow | |
| 5,321,283 A | 6/1994 | Cogan et al. | |
| 5,382,533 A | 1/1995 | Ahmad et al. | |
| 5,514,902 A | 5/1996 | Kawasaki et al. | |
| 5,571,734 A * | 11/1996 | Tseng et al. | 438/591 |
| 5,714,788 A | 2/1998 | Ngaoaram | |
| 5,767,558 A | 6/1998 | Lo et al. | |
| 6,069,062 A | 5/2000 | Downey | |
| 6,191,463 B1 * | 2/2001 | Mitani et al. | 257/411 |
| 6,313,020 B1 | 11/2001 | Kim et al. | |
| 6,436,783 B1 | 8/2002 | Ono et al. | |
| 6,713,360 B2 | 3/2004 | Jain et al. | |
| 6,847,089 B2 | 1/2005 | Chakravarthi et al. | |
| 7,018,880 B2 | 3/2006 | Hao et al. | |
| 7,371,648 B2 | 5/2008 | Chen et al. | |
| 2002/0125479 A1 | 9/2002 | Lippert et al. | |
| 2003/0214767 A1 | 11/2003 | Singh et al. | |
| 2004/0031970 A1 | 2/2004 | Chakravarthi et al. | |
| 2004/0102013 A1 | 5/2004 | Hwang et al. | |
| 2004/0173843 A1 | 9/2004 | Noda | |
| 2004/0188774 A1 | 9/2004 | Takeda et al. | |
| 2005/0208764 A1 | 9/2005 | Lu et al. | |
| 2008/0014698 A1 * | 1/2008 | Prall et al. | 438/257 |

FOREIGN PATENT DOCUMENTS

JP    08-316465    11/1996

OTHER PUBLICATIONS

Balasinski, A., et.al., "Interface Properties in Fluorinated (100) and (111)Si/SiO$_2$ MOSFETs," Microelectronic Engineering 22 (1993), pp. 97-100, Elsevier Science Publishers B.V.

Brederlow, R., et.al., "Influence of Fluorinated Gate Oxides on the Low Frequency Noise of MOS Transistors under Analog Operation," ESSDERC 1998, Sep. 8-10, 1998, pp. 472-475, Proceeding of the 28th European Solid-State Device Research Conference, 1998.

(Continued)

*Primary Examiner* — Calvin Lee
(74) *Attorney, Agent, or Firm* — Slater & Matsil, L.L.P.

(57) ABSTRACT

A low noise transistor and a method of making a low noise transistor. A noise-reducing agent is introduced into the gate electrode and then moved into the gate dielectric of a transistor.

105 Claims, 4 Drawing Sheets

OTHER PUBLICATIONS

Wright, P., et al., "The Effect of Fluorine in Silicon Dioxide Gate Dielectrics," IEEE Transactions on Electron Devices, May 1989, pp. 879-889, vol. 36, No. 5.

Kato, Y., et al., "Improvement of Metal-Oxide Semiconductor Interface Characteristics in Complementary Metal-Oxide Semiconductor on Si(111) by Combination of Fluorine Implantation and Long-Time Hydrogen Annealing," Japanese Journal of Applied Physics, 2006, pp. L108-L110, vol. 45, No. 4.

Diebel, M., et al., "Investigation and modeling of fluorine co-implantation effects on dopant redistribution," Materials Research Society Symposium Proceedings, vol. 765, 2003, 6 pages.

Chakravarthi, S., et al., "Process Modeling Based on Atomistic Understanding for State of the Art CMOS Device Design," Nanotech 2003, vol. 2, Technical Proceedings of the 2003 Nanotechnology Conference and Trade Show, Feb. 23-27, 2003, pp. 121-124, San Francisco, CA.

* cited by examiner

LOW NOISE TRANSISTOR AND METHOD OF MAKING SAME

TECHNICAL FIELD

Generally, the present invention relates to transistors and methods of making transistors. In particular, the present invention relates to low noise transistors and methods for making low noise transistors.

BACKGROUND

Low frequency, or 1/f noise (also referred to as flicker noise), is a dominant noise source in field-effect transistors (such as MOSFET devices). While not wishing to be bound by theory, the 1/f noise may be caused by carriers, such as electrons or holes, being transiently trapped in the gate dielectric and/or the interface between the gate dielectric and the channel of the transistor. The random translocation of carriers into traps or defect centers, such as silicon dangling bonds, into the gate dielectric and back into the channel, may cause the current through the transistor to fluctuate, which manifests as 1/f noise.

The push toward smaller and faster semiconductor devices has increased the need to reduce 1/f noise. The effect of 1/f noise may be partially reduced by using transistors having large device areas in the initial stages so that 1/f noise does not get amplified to the same extent as the signal in subsequent stages of an amplification circuit. This approach, however, may not prevent 1/f noise from being introduced at later amplification stages in the circuit where smaller transistors are used. Moreover, the dimensions to which such devices can be scaled down may be limited by the necessity for one or more large early stage transistors. Hence, there is a need for new approaches to reducing 1/f noise.

SUMMARY OF THE INVENTION

An embodiment of the invention is a field effect transistor, comprising: a semiconductor material, the semiconductor material including a source region, a drain region and a channel region between the source and drain regions; a gate stack formed over the channel region, the gate stack including a gate dielectric formed over the semiconductor material and a gate electrode form over the gate dielectric; and a noise-reducing agent disposed in the gate electrode, the gate dielectric, the source region and the drain region, the noise-reducing reducing the 1/f noise of the transistor.

Another embodiment of the invention is a method of forming a field effect transistor, comprising: forming a gate stack over a semiconductor material, the gate stack including a gate dielectric formed over the semiconductor material and a gate electrode formed over the gate dielectric; introducing a noise-reducing agent into the gate electrode, the noise reducing agent reducing the 1/f noise of the transistor; and moving at least a portion of the agent from the gate electrode to the gate dielectric.

Another embodiment of the invention is a method of forming a field effect transistor, comprising: forming a gate stack over a substrate, the gate stack including a gate electrode and a gate dielectric, the gate dielectric being between the gate electrode and the substrate; introducing a noise-reducing agent into the gate electrode and into the substrate, the noise reducing agent reducing the 1/f noise of the transistor; and moving at least a portion of the agent from the gate electrode and from the substrate into the gate dielectric.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
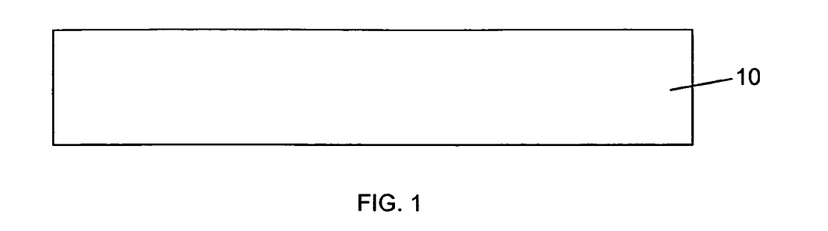
FIG. 1 shows an embodiment of a substrate of an embodiment of a partially completed transistor structure of the present invention.
Figure 2:
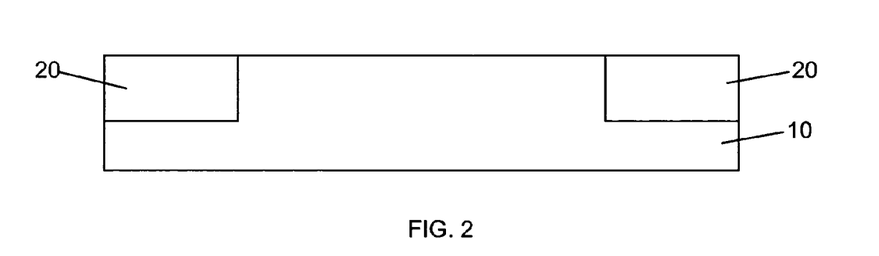
FIG. 2 shows the incorporation of isolation regions into the substrate from FIG. 1.

Referring to FIG. 1, a substrate 10 is provided. The substrate may be a silicon substrate or other suitable substrate. The substrate may be a silicon-on-insulator (SOI) substrate. The SOI substrate may, for example, be formed by a SIMOX process. The substrate may be a silicon-on-sapphire (SOS) substrate. Referring to FIG. 2, isolation regions 20 are defined in the substrate. In the embodiment shown, the isolation regions 20 are shown as trenches etched into the substrate 10 that have been filled with an insulating material, such as $SiO_2$ or other suitable insulating material, to insulate one transistor cell from adjacent transistor cells. In the embodiment shown, the isolation regions 20 are formed using a shallow trench isolation (STI) process. However, in other embodiments of the invention, isolation regions may be formed otherwise, such as by a LOCOS process.

Figure 3:
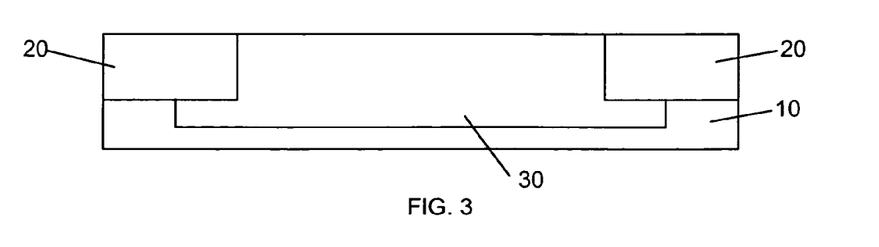
FIG. 3 shows the incorporation of a p-well into the structure from FIG. 2.

Referring to FIG. 3, a p-type well 30 is formed in the substrate 10. The p-type well may be formed by doping the substrate with a p-type dopant. An example of a p-type dopant is boron.

Figure 4:
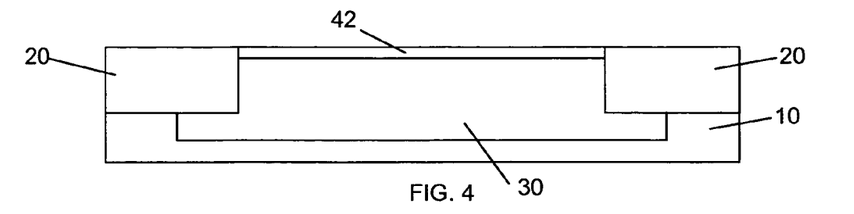
FIG. 4 shows the formation of a gate dielectric material.

Referring to FIG. 4, after the formation of p-type well 30, a gate dielectric material 42 is formed over the substrate 10. The gate dielectric material 42 may include an oxide. An example of an oxide is silicon dioxide ($SiO_2$). In an embodiment of the invention, the gate dielectric material 42 may be an oxide (such as silicon dioxide) that is formed by a growth process. Another example of an oxide is tantalum oxide. The gate dielectric material 42 may include a nitride. An example of a nitride is silicon nitride. The gate dielectric material 42 may include a nitrided oxide. The gate dielectric material may include an oxynitride. The dielectric material 42 may include SiON. The gate dielectric material 42 may include $SiO_xN_y$. The gate dielectric material 42 may include a high-k dielectric. As one example, the high-k dielectric may have a dielectric constant greater than that of silicon dioxide. In another example, the high-k dielectric may have a dielectric constant greater than about 3.9. The gate dielectric material 42 may be formed of a composite of two or more materials. In an embodiment of the invention, the gate dielectric material 42 may have a thickness between about 3 nm to about 6 nm.

Figure 5:
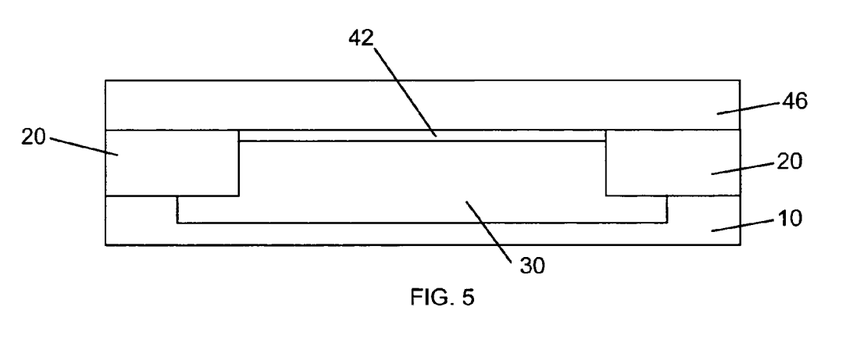
FIG. 5 shows the formation of a gate electrode material.

Referring to FIG. 5, a gate electrode material 46 is then formed over the gate dielectric material 42. The gate electrode material 46 may include a polysilicon material. The gate electrode material 46 may include a conductive material. The gate electrode material 46 may include a metallic material such as a pure metal or a metal alloy. The gate electrode material 46 may be formed as a composite of two or more materials. In one or more embodiments of the invention, the gate electrode material 46 may have a thickness of about 100 nm to about 200 nm.

Figure 6:
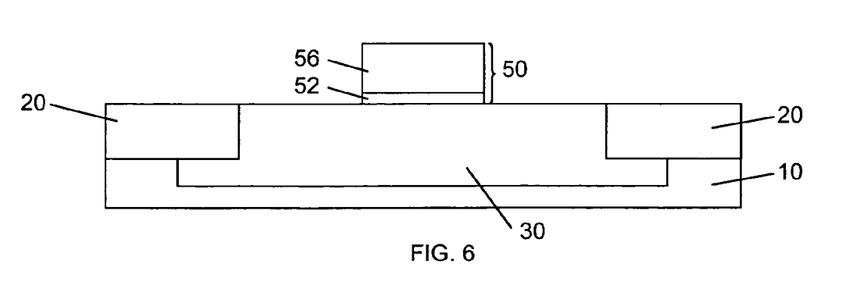
FIG. 6 shows the formation of a gate stack.

The gate electrode material 46 and the gate dielectric material 42 are then masked and etched to form the gate stack 50 that is shown in FIG. 6. Gate stack 50 includes a gate dielectric 52 which is formed of the gate dielectric material 42 of FIG. 5. The gate stack 50 further includes a gate electrode 56 which is formed of the gate electrode material 46 of FIG. 5.

The gate dielectric 52 is formed of the gate dielectric material. It is noted that the gate dielectric may be formed as a composite of two or more different materials. Likewise, the gate dielectric may be formed as a stack of two or more different material layers.

The gate electrode is formed of the gate electrode material. It is noted that the gate electrode may be formed as a composite of two or more different materials. Likewise, the gate electrode may be formed as a stack of two or more different material layers. As an example, the gate electrode may include a metal layer disposed over the top of a polysilicon layer. Alternately, the gate electrode may include a silicide layer disposed over the top of a polysilicon layer. An example of a silicide layer is tungsten silicide.

In addition, the gate stack 50 may include additional layers besides the gate dielectric 52 and the gate electrode 56. For example, it is possible that the gate stack includes an additional pre-gate layer between the gate dielectric 52 and the substrate 10. Likewise, it is also possible that the gate stack 50 may include a buffer layer between the gate dielectric and the gate electrode.

Figure 7:
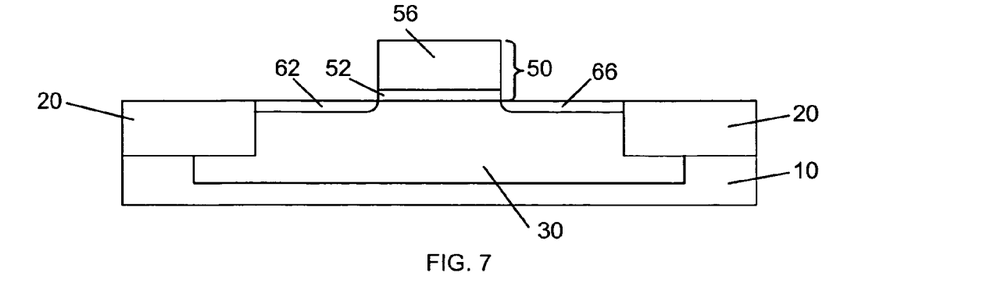
FIG. 7 shows the formation of the LDD regions in the structure from FIG. 6.

After the formation of the gate stack 50, the structure shown in FIG. 6 is appropriately doped with an n-type lightly doped drain implant (LDD) to form the lightly (n-) doped LDD regions 62 and 66. The dopant used may be arsenic. The resulting structure is shown in FIG. 7.

Figure 8:
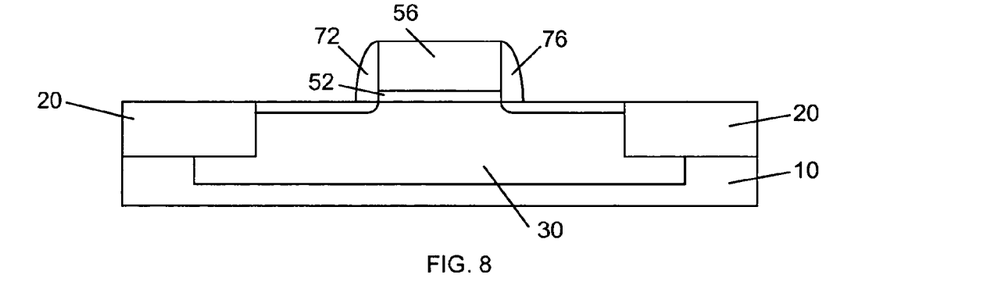
FIG. 8 shows the formation of dielectric sidewall spacers on the sidewalls of the gate stack from FIG. 7.

As shown in FIG. 8, dielectric sidewall spacers 72 and 76 are then formed on the sidewalls of the gate stack 50. The dielectric sidewall spacers may be formed by the deposition of a dielectric material on the top and sidewall surfaces of the structure shown in FIG. 7 followed by an anisotropic etch of the dielectric material. The dielectric sidewall spacers may be formed of a nitride, an oxide (such as TEOS oxide) or a combination of an oxide and a nitride. The dielectric sidewall spacers may be formed by first forming a first spacer (such as a nitride spacer) on the sidewalls of the gate stack 50 and then forming a second spacer (such as a TEOS spacer) on the sidewalls of the first spacer.

Figure 9:
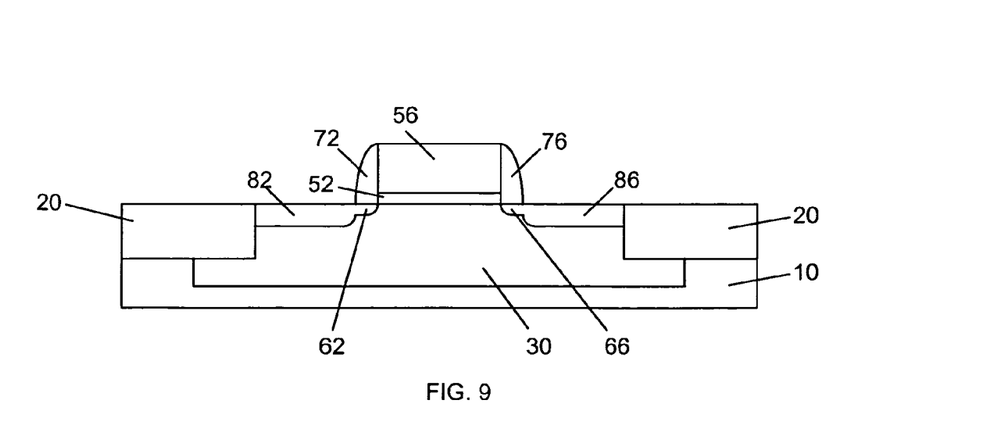
FIG. 9 shows the formation of the source/drain regions in the structure from FIG. 8.

Referring to FIG. 9, after the formation of the dielectric sidewall spacers 72, 76, the structure shown in FIG. 8 is then doped again with an n-type dopant to form the more heavily doped n+ source/drain regions 82 and 86. Arsenic may be used as the dopant.

Figure 10:
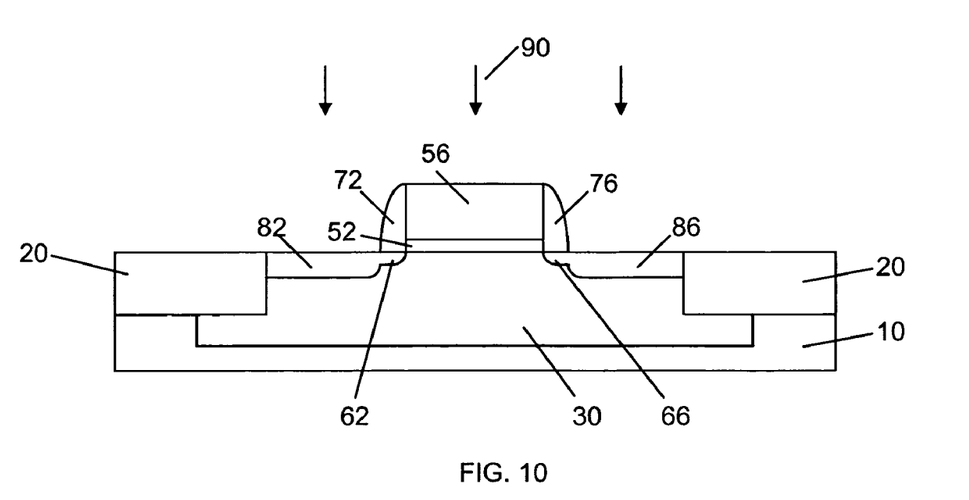
FIG. 10 shows the ion-implantation of a material that includes a noise-reducing agent into the gate electrode and into the source/drain regions of the structure from FIG. 9.

Referring to FIG. 10, after the formation of the source/drain regions 82, 86 (also referred to herein as a source/drain pair) a noise-reducing agent is then introduced into the structure from FIG. 9. Generally, a noise-reducing agent (also referred to herein as an NR agent) may be any material that reduces the 1/f noise of the transistor. As noted above, while not wishing to be bound by theory, the 1/f noise may be caused by carriers, such as electrons or holes, being transiently trapped in the gate dielectric and/or the interface between the gate dielectric and the channel of the transistor. The random translocation of carriers into traps or defect centers, such as silicon dangling bonds, into the gate dielectric and back into the channel, may cause the current through the transistor to fluctuate, which manifests as 1/f noise. Hence, in one or more embodiments of the invention, the NR agent may be any material effective to reduce the number of such traps in the transistor.

In one or more embodiments of the invention, the NR agent may include one or more halogen elements. In one or more embodiments of the invention, the noise-reducing agent may include one or more of the elements selected from the group consisting of fluorine, chlorine, bromine, iodine, and astatine. In one or more embodiments of the invention, the NR agent may include the element fluorine. In one or more embodiments of the invention, the noise-reducing agent may include deuterium. In one or more embodiments of the invention the noise-reducing agent may include hydrogen.

In one or more embodiments of the invention, the noise-reducing agent may be a halogen element. In one or more embodiments of the invention, the noise-reducing agent may be one or more of the elements selected from the group consisting of fluorine, chlorine, bromine, iodine, and astatine. In one or more embodiments of the invention, the NR agent may be the element fluorine. In one or more embodiments of the invention, the noise-reducing agent may be deuterium. In one or more embodiments of the invention the noise-reducing agent may be hydrogen.

In one or more embodiments of the invention, the noise-reducing agent may be in the form of atoms (for example, atoms of fluorine, atoms of chlorine, atoms of bromine, atoms of iodine and/or atoms of astatine). The atoms may be in the form of ions. In one or more embodiments of the invention, the noise-reducing agent may be in the form of molecules (for example, molecules that include the element fluorine, molecules that include the element chlorine, molecules that include the element bromine, molecules that include the element iodine and/or molecules that include the element astatine). The molecules may be in the form of ions.

In the embodiment shown in FIG. 10, the NR agent is introduced into the gate electrode 56. The NR agent is also introduced into the source and drain regions 82 and 86. The NR agent may be introduced into the gate electrode and into the source/drain regions using an ion implantation process. The ion implantation species is shown as species 90 in FIG. 10. A photoresist mask may be used to protect those areas of the structure that are not implanted with the NR agent.

In an embodiment of the invention, the NR agent (i.e. the noise-reducing agent) is ion implanted into the gate electrode of the electrode stack but essentially none of the NR agent is ion implanted into the gate dielectric. In another embodiment of the invention, the ratio of NR agent ion implanted into the gate dielectric to that that ion implanted in the entire gate stack is less than 10%. In another embodiment of the invention, the ratio of NR agent ion implanted into the gate dielectric to that that ion implanted in the entire gate stack is less than 5%. In another embodiment of the invention, the ratio of NR agent ion implanted into the gate dielectric to that that ion implanted in the entire gate stack is less than 1%. Since essentially none or very little of the noise-reducing agent is ion implanted into the gate dielectric it may thus possible that the gate dielectric suffers little or no damage from the noise-reduction process described herein.

In an embodiment of the invention, an ion implantation energy is used so that the NR agent is ion implanted into the gate electrode of the electrode stack but essentially none of the NR agent is introduced into the gate dielectric. In one embodiment of the invention, the ion implantation energy may be about 10 keV or greater. In another embodiment of the invention, the ion implantation energy may be about 10 keV and to about 20 keV. In another embodiment of the invention, the ion implantation may be about 10 keV to about 15 keV. In another embodiment of the invention, the ion implantation is less than or equal to about 15 keV. As an example, in an embodiment of the invention, the ion implantation energy may be about 15 keV.

In one embodiment of the invention, the dose of the ion implanted species that includes the noise-reducing agent may be greater than about 1E15 ions/cm$^2$. In another embodiment of the invention, the dose of the ion implanted species may be between about 1E15 ions/cm$^2$ and about 2E16 ions/cm$^2$. In an embodiment of the invention, the dose of the ion implanted species may be greater than or equal about 5E15 ions/cm$^2$. In an embodiment of the invention, the dose of the ion implanted species that includes the noise-reducing agent may be greater than or equal to about 1E16 ions/cm$^2$. As an example, in one embodiment of the invention, the dose of the ion implanted species may be about 5E15 ions/cm$^2$.

In one or more embodiments of the invention, the noise-reducing agent may be ion implanted into the gate electrode and/or into the source/drain regions of the substrate by ion implanting one or more ionic species that include the noise-reducing agent. The ionic species may include ions of atoms of the noise-reducing agent. Likewise, the ionic species may include ions of molecules that include the noise-reducing agents. For example, if the noise-reducing agent is fluorine, then the fluorine may be ion implanted by the ion implantation of a fluorine-containing ion. The fluorine-containing ion may, for example, be an ion of an atom of fluorine (such as F+). The fluorine-containing ion may, for example, be an ion of a molecule that includes fluorine (such as a silicon difluoride ion or a silicon trifluoride ion). As examples, other molecules that may be ion implanted include ions of boron difluoride ($BF_2$), boron trifluoride ($BF_3$), $PF_3$, $PF_5$, $AsF_3$, $AsF_5$, $SbF_3$, $SbF_5$, $XeF_2$, xenon hexafluoride ($XeF_6$), SiF and $ClF_5$. Likewise, the chlorine may be ion implanted into the gate electrode and/or into the source/drain regions of the substrate by ion implantation of ions of atoms of chlorine (such as Cl+). The chlorine may be ion implanted by ion implantation of ions of molecules of chlorine (such as $ClF_5$, $BCl_3$, and $SiCl_4$).

As an example, the noise-reducing agent may be fluorine. In this case, the fluorine may be introduced into the gate electrode and/or into the source/drain regions of the substrate by ion implanting F+ ions. Also, the fluorine may be introduced by ion implanting with ions of boron difluoride and/or boron trifluoride, In the embodiment shown in FIG. 10, the noise-reducing agent is ion implanted into the source/drain region 82, 86 which are spacedly disposed from the gate stack. The LDD regions 62, 66 adjacent to the gate stack may be protected from the ion implantation process by the dielectric sidewall spacers 72, 76. Hence, the dielectric sidewall spacers may prevent the areas of the substrate laterally adjacent to the gate stack from be damaged by the ion implantation process.

As a next step in the process, the structure shown in FIG. 10 (having been ion implanted with the noise-reducing agent) is subjected to an annealing process. Preferably, the annealing process is effective to cause at least a portion of the NR agent that is in the gate electrode and/or at least a portion of the NR agent that is in the source/drain regions of the substrate to diffuse into the gate dielectric. More preferably, the annealing process is effective to cause at least a portion of the NR agent that is in gate electrode as well as at least a portion of the NR agent that is in the source/drain regions to diffuse into the gate dielectric.

The anneal process may, for example, be a rapid thermal anneal process. In an embodiment of the invention, the anneal process may heat the structure to a temperature greater than about 700° C. In an embodiment of the invention, the anneal process may heat the structure to a temperature greater than about 800° C. In an embodiment of the invention, the anneal process may heat the structure to a temperature greater than about 900° C. In an embodiment of the invention, the anneal process may heat the structure to a temperature between about 700° C. and about 1200° C. In an embodiment of the invention, the anneal process may heat the structure to a temperature between about 800° C. and about 1100° C. In another embodiment of the invention, the anneal process may heat the structure to a temperature between about 900° C. and about 1000° C. As an example, the anneal process may heat the structure to a temperature of about 990° C.

In an embodiment of the invention, the anneal process may heat the structure for about 10 seconds or less. In an embodiment of the invention, the anneal process may heat the structure for about 3 to about 7 seconds. In an embodiment of the invention, the anneal process may heat the structure for about 4 to about 6 seconds. As an example, the anneal process may heat the structure for about 5 seconds.

Hence, the NR agent is introduced into the gate dielectric without being placed there through an ion-implantation process. Hence, while not wishing to be bound by theory, it may thus be possible to introduce the noise-reducing agent into the gate dielectric without damaging the gate dielectric through an ion implantation process.

The same anneal process for diffusing the NR agent from the gate electrode to the gate dielectric may be the same anneal process used anneal the source and drain regions. Hence, there may be no need for a separate annealing step. However, in another embodiment of the invention, the anneal process used for diffusing the noise-reducing agent from the gate electrode to the gate dielectric may be a separate anneal process from that used to anneal the source and drain regions.

More generally, in one or more embodiments of the invention, the noise-reducing agent may be ion implanted into the transistor structure at any time after the formation of the gate stack. In another embodiment of the invention, the noise-reducing agent (i.e., the NR agent) may be ion implanted into the structure shown in FIG. 6, after the formation of the gate stack but before the formation of the lightly doped source/drain regions (e.g., before the formation of the LDD regions shown in FIG. 7). Hence, in this case the NR agent will be ion implanted into the gate stack as well as into the regions of the substrate adjacent to the gate stack. The lateral distance of the substrate adjacent to the gate stack that is ion implanted may be appropriate controlled through masking techniques. It is possible, in an embodiment of the invention, that only the gate electrode, and not the neighboring substrate, is ion implanted with the noise-reducing agent.

Also, in another embodiment of the invention, the noise-reducing agent may be ion implanted into the structure shown in FIG. 7, after the formation of the LDD regions 62, 66 and before the formation of the dielectric sidewall spacers 72, 76 shown in FIG. 8. In another embodiment of the invention, the noise-reducing agent may be ion implanted into the structure shown in FIG. 8, after the formation of the sidewall spacers 72, 76 but before the formation of the source/drain regions 82, 86 shown in FIG. 9. Also, referring to FIG. 8, is was discussed above that the dielectric sidewall spacer may be formed by forming first sidewall spacers on the sidewalls of the gate stack and then forming second sidewall spacers on the sidewalls of the first sidewall spacers. Hence, it is possible that the NR agent be ion implanted after the formation of the first sidewall spacers but before the formation of the second sidewall spacers.

Hence, in one or more embodiments of the invention, it is possible that the NR agent be ion implanted at any time after the formation of the gate stack. In one or more embodiments of the invention, it is possible that only the gate electrode is ion implanted without ion implanting the neighboring regions of the substrate. In one or more embodiments of the invention, one or more regions of the substrate may also be ion implanted with the noise-reducing (i.e., NR) agent. In one or more embodiments, at least a portion of the LLD regions of the substrate may be ion implanted with the NR agent. In one or more embodiments of the invention, at least a portion of the source/drain regions may be ion implanted with the NR agent.

In yet another embodiment of the invention, it is possible to ion implant the noise-reducing agent into one or more regions of the substrate (which may or may not include at least a portion of the source/drain regions of the substrate) without also ion implanting the NR agent into the gate electrode. In this case, as a result of the anneal process, the NR agent would enter the gate dielectric from the one or more NR agent implanted regions of the substrate.

Additionally, as described above, in an embodiment of the invention, the annealing process used for annealing the source/drain regions may be the same annealing process used for diffusing the NR agent into the gate dielectric from the gate electrode and/or the source/drain regions. In another embodiment of the invention, there may be one or more separate annealing steps used for diffusing the NR agent into the gate dielectric from the gate electrode and/or from other regions of the substrate (such as from the source/drain regions of the substrate).

It is noted that the noise-reduction methods described herein are applicable to forming both n-channel and p-channel transistors. FIG. 10, shows the formation of an n-channel transistor having p-type well 30 and n-type source/drain regions 82, 86. However, a p-channel transistor could have been easily formed by replacing p-type well 30 with an n-type well and by replacing n-type source/drain regions with p-type source/drain regions. In addition, the methods are applicable for forming planar field effect (FET) transistors (e.g., MOSFET) as well as multi-gate field effect transistors (e.g. mugFET). The multi-gate transistor may be a finFET. In a finFET, the channel regions, source region and drain region may be located in a raised semiconductor fin.

It is noted that, in one or more embodiments of the invention, the ion implantation process for the noise-reducing agent is separate and distinct from the ion implantation process for making the source/drains regions of the transistor. In one or more embodiments of the present invention, the ion implantation process for the noise-reducing agent is a distinct and separate process from this LDD implant process. Hence, in one or more embodiments of the invention, the processing steps for doping the LLD regions as well as the processing steps for doping the source/drain regions are distinct from the processing steps for introducing the noise-reducing agent (either into the gate electrode or into the source/drain regions).

It is further noted, that one or more n-channel and/or p-channel transistors may be made using the techniques described herein. The transistors may be part of a much larger integrated circuit. The integrated circuit may, for example, be logic device, a memory device or a logic device embedded with a memory device. The integrated circuit may include many transistors. In one or more embodiments of the invention, when forming an integrated circuit, it is possible that only a portion of the transistors of the integrated circuit incorporate the noise-reducing agent. In one or more embodiments of the invention, it may be possible that the n-channel transistors include the noise-reducing agent while the p-channel transistors do not.

It is further noted that in one or more embodiments of the invention, the noise-reducing agent may be effective to reduce the 1/f noise of the transistor by at least 30% (when compared with the same transistor without the noise-reducing agent). In one or more embodiments of the invention the noise-reducing agent may be effective to reduce the 1/f noise of the transistor by at least 40%. In one or more embodiments of the invention the noise-reducing agent may be effective to reduce the 1/f noise of the transistor by at least 50%.

Although the invention has been described in terms of certain embodiments, it will be obvious to those skilled in the art that many alterations and modifications may be made without departing from the invention. Accordingly, it is intended that al such alterations and modifications be included within the spirit and scope of the invention.

What is claimed is:

1. A method of forming a semiconductor device, comprising:
   forming a gate stack over a semiconductor material, said gate stack including a gate dielectric formed over said semiconductor material and a gate electrode formed over said gate dielectric;
   forming a dielectric sidewall spacer over a sidewall of said gate stack;
   implanting source/drain dopants into said semiconductor material after forming said sidewall spacer;
   introducing a noise-reducing agent into at least said gate electrode after forming said sidewall spacer, wherein the noise-reducing agent is introduced into some but not all n-channel transistors in the semiconductor device; and
   performing a anneal process after introducing said noise-reducing agent and after implanting said source/drain dopants.

2. The method of claim 1, wherein said anneal process moves at least a portion of said noise-reducing agent into said gate dielectric.

3. The method of claim 1, wherein said anneal process has a temperature of at least about 900°.

4. The method of claim 1, wherein said anneal process has a temperature of at least about 990° C.

5. The method of claim 1, wherein said anneal process has a duration of about 10 seconds or less.

6. The method of claim 1, wherein said anneal process has a duration of about 5 seconds or less.

7. The method of claim 1, wherein said noise-reducing agent is introduced without placing essentially any of said agent into said gate dielectric.

8. The method of claim 1, wherein said noise-reducing agent comprises at least one halogen element.

9. The method of claim 1, wherein said noise-reducing agent comprises fluorine.

10. The method of claim 1, wherein said noise-reducing agent is a halogen element.

11. The method of claim 1, wherein said noise-reducing agent is fluorine.

12. The method of claim 1, wherein introducing said noise-reducing agent comprises ion implantation.

13. The method of claim 1, wherein said noise-reducing agent is introduced by implantation of ions of atoms.

14. The method of claim 1, wherein said noise-reducing agent is introduced by implantation of ions of molecules.

15. The method of claim 1, wherein said semiconductor material is a semiconductor substrate.

16. The method of claim 1, wherein said semiconductor material is a fin of a finFET.

17. The method of claim 1, wherein said source/drain dopants are implanted before introducing said noise-reducing agent.

18. The method of claim 1, wherein said source/drain dopants are implanted after introducing said noise-reducing agent.

19. The method of claim 1, further comprising implanting LDD dopants into said semiconductor material before forming said dielectric sidewall spacer.

20. The method of claim 1, wherein said introducing said noise-reducing agent comprises implanting said noise-reducing agent at a dose greater than about $5 \times 10^{15}$ cm$^{-2}$.

21. The method of claim 1, wherein there is no additional anneal performed between implanting said source/drain dopants and introducing said noise-reducing agent.

22. The method of claim 1, wherein said anneal process is a rapid thermal anneal.

23. The method of claim 1, wherein the noise-reducing agent is introduced into the gates of some but not into the gates all n-channel transistors in the semiconductor device.

24. A method of forming a semiconductor device, comprising:
   forming a gate stack over a semiconductor material, said gate stack including a gate dielectric formed over said semiconductor material and a gate electrode formed over said gate dielectric;
   forming a dielectric sidewall spacer over a sidewall of said gate stack;
   implanting source/drain dopants into said semiconductor material after forming said sidewall spacer;
   introducing fluorine into at least said gate electrode after forming said sidewall spacer, wherein the fluorine is introduced into some but not all n-channel transistors in the semiconductor device; and
   performing a anneal process after introducing said fluorine and after implanting said source/drain dopants.

25. The method of claim 24, wherein said anneal process moves at least a portion of said fluorine into said gate dielectric.

26. The method of claim 24, wherein said anneal process has a temperature of at least about 900° C.

27. The method of claim 24, wherein said anneal process has a duration of about 10 seconds or less.

28. The method of claim 24, wherein said fluorine is introduced into said gate electrode without placing essentially any of said fluorine into said gate dielectric.

29. The method of claim 24, wherein introducing said fluorine comprises ion implantation.

30. The method of claim 24, wherein said semiconductor material is a semiconductor substrate.

31. The method of claim 24, wherein said semiconductor material is a fin of a finFET.

32. The method of claim 24, wherein said source/drain dopants are implanted before introducing said fluorine.

33. The method of claim 24, wherein said source/drain dopants are implanted after introducing said fluorine.

34. The method of claim 24, wherein there is no additional anneal performed between implanting said source/drain dopants and introducing said fluorine.

35. The method of claim 24, wherein said anneal process is a rapid thermal anneal.

36. The method of claim 24, wherein the fluorine is introduced into the gates of some but not into the gates all n-channel transistors in the semiconductor device.

37. A method of forming a field effect transistor, comprising:
   forming a gate stack over a semiconductor material, said gate stack including a gate dielectric formed over said semiconductor material and a gate electrode formed over said gate dielectric;
   forming a dielectric sidewall spacer over a sidewall of said gate stack;
   implanting source/drain dopants into said semiconductor material after forming said dielectric sidewall spacer;
   introducing a noise-reducing agent into at least said gate electrode after forming said dielectric sidewall spacer, wherein introducing said noise-reducing agent comprises implanting said noise-reducing agent at a dose greater than $5 \times 10^{15}$ cm$^{-2}$; and
   performing an anneal process after introducing said noise-reducing agent and after implanting said source/drain dopants.

38. The method of claim 37, wherein said noise-reducing agent is introduced without placing essentially any of said agent into said gate dielectric.

39. The method of claim 37, wherein said noise-reducing agent comprises at least one halogen element.

40. The method of claim 37, wherein said noise-reducing agent comprises fluorine.

41. The method of claim 37, wherein introducing said noise-reducing agent comprises ion implantation.

42. The method of claim 37, wherein said semiconductor material is a semiconductor substrate.

43. The method of claim 37, wherein said semiconductor material is a fin of a finFET.

44. The method of claim 37, wherein said anneal process moves at least a portion of said noise-reducing agent into said gate dielectric.

45. The method of claim 37, wherein said anneal process has a temperature of at least about 990° C.

46. The method of claim 37, wherein said anneal process has a temperature between about 900° C. and about 1200° C.

47. The method of claim 37, wherein said anneal process has a duration of about 5 seconds or less.

48. The method of claim 37, wherein said anneal process has a temperature of at least about 990° C. and a duration of about 5 seconds or less.

49. The method of claim 37, wherein said noise-reducing agent is a halogen element.

50. The method of claim 37, wherein said noise-reducing agent is fluorine.

51. The method of claim 37, wherein said noise-reducing agent is introduced by implantation of ions of atoms.

52. The method of claim 37, wherein said noise-reducing agent is introduced by implantation of ions of molecules.

53. The method of claim 37, wherein said source/drain dopants are implanted before introducing said noise-reducing agent.

54. The method of claim 37, wherein said source/drain dopants are implanted after introducing said noise-reducing agent.

55. The method of claim 37, wherein there is no additional anneal performed between implanting said source/drain dopants and introducing said noise-reducing agent.

56. The method of claim 37, wherein the dose of implanting said noise-reducing agent is greater than or equal to about $1\times10^{16}$ cm$^{-2}$.

57. The method of claim 37, wherein said anneal process having a temperature greater than about 900° C. and a duration of about 10 seconds or less.

58. A method of forming a field effect transistor, comprising:
    forming a gate stack over a semiconductor material, said gate stack including a gate dielectric formed over said semiconductor material and a gate electrode formed over said gate dielectric;
    forming a dielectric sidewall spacer over a sidewall of said gate stack;
    implanting source/drain dopants into said semiconductor material after forming said sidewall spacer;
    introducing fluorine into at least said gate electrode after forming said sidewall spacer, wherein said introducing said fluorine comprises implanting said fluorine at a dose greater than $5\times10^{15}$ cm$^{-2}$; and
    performing an anneal process after introducing said fluorine and after implanting said source/drain dopants.

59. The method of claim 58, wherein said anneal process moves at least a portion of said fluorine into said gate dielectric.

60. The method of claim 58, wherein said fluorine is introduced into said gate electrode without placing essentially any of said fluorine into said gate dielectric.

61. The method of claim 58, wherein said anneal process has a temperature of at least about 990° C.

62. The method of claim 58, wherein said anneal process has a temperature between about 900° C. and about 1200° C.

63. The method of claim 58, wherein said anneal process has a temperature between about 990° C. and about 1200° C.

64. The method of claim 58, wherein said anneal process has a duration of about 5 seconds or less.

65. The method of claim 58, wherein said anneal process has a temperature of at least about 990° C. and a duration of about 5 seconds or less.

66. The method of claim 58, wherein introducing said fluorine comprises ion implantation.

67. The method of claim 58, wherein said semiconductor material is a semiconductor substrate.

68. The method of claim 58, wherein said semiconductor material is a fin of a finFET.

69. The method of claim 58, wherein said source/drain dopants are implanted before introducing said fluorine.

70. The method of claim 58, wherein said source/drain dopants are implanted after introducing said fluorine.

71. The method of claim 58, wherein said anneal process having a temperature greater than about 900° C. and a duration of about 10 seconds or less, and wherein there is no additional anneal performed between implanting said source/drain dopants and introducing said fluorine.

72. A method of forming a field effect transistor, comprising:
    forming a gate stack over a semiconductor material, said gate stack including a gate dielectric formed over said semiconductor material and a gate electrode formed over said gate dielectric;
    forming a dielectric sidewall spacer over a sidewall of said gate stack;
    introducing source/drain dopants into said semiconductor material after forming said sidewall spacer;
    introducing a noise-reducing agent into at least said gate electrode after forming said sidewall spacer, wherein the introducing comprises implanting said noise-reducing agent at a dose greater than $5\times10^{15}$ cm$^{-2}$, wherein an energy of the implanting is about 10 keV and to about 20 keV, and wherein the gate dielectric has a thickness between about 3 nm to about 6 nm; and
    performing an anneal process after introducing said noise-reducing agent and after introducing said source/drain dopants.

73. The method of claim 72, wherein said noise-reducing agent is introduced without placing essentially any of said agent into said gate dielectric.

74. The method of claim 72, wherein said noise-reducing agent comprises at least one halogen element.

75. The method of claim 72, wherein said noise-reducing agent comprises fluorine.

76. The method of claim 72, wherein said noise-reducing agent is at least one halogen element.

77. The method of claim 72, wherein said noise-reducing agent is fluorine.

78. The method of claim 72, wherein introducing said noise-reducing agent comprises ion implantation.

79. The method of claim 72, wherein said noise-reducing agent is introduced by implantation of ions of atoms.

80. The method of claim 72, wherein said noise-reducing agent is introduced by implantation of ions of molecules.

81. The method of claim 72, wherein said semiconductor material is a semiconductor substrate.

82. The method of claim 72, wherein said semiconductor material is a fin of a finFET.

83. The method of claim 72, wherein said noise-reducing agent is introduced after introducing said source/drain dopants.

84. The method of claim 72, wherein said noise-reducing agent is introduced before introducing said source/drain dopants.

85. The method of claim 72, further comprising introducing LDD dopants into said semiconductor material before forming said dielectric sidewall spacer.

86. The method of claim 72, wherein said field effect transistor is a p-type field effect transistor.

87. The method of claim 72, wherein said noise-reducing agent comprises bromine, iodine, or astatine.

88. The method of claim 72, wherein there is no additional anneal performed between introducing said source/drain dopants and introducing said noise-reducing agent.

89. The method of claim 72, wherein the noise-reducing agent is introduced only into the gate electrode and not said semiconductor material.

90. A method of forming a field effect transistor, comprising:
    forming a gate stack over a semiconductor material, said gate stack including a gate dielectric formed over said semiconductor material and a gate electrode formed over said gate dielectric;
    forming a dielectric sidewall spacer over a sidewall surface of said gate stack;

introducing source/drain dopants into said semiconductor material after forming said sidewall spacer;

introducing fluorine into said semiconductor material after forming said sidewall spacer, wherein said introducing comprises implanting said fluorine at a dose greater than $5\times10^{15}$ cm$^{-2}$, wherein an energy of the implanting is about 10 keV and to about 20 keV, and wherein the gate dielectric has a thickness between about 3 nm to about 6 nm; and performing an anneal process after introducing said fluorine and after introducing said source/drain dopants.

91. The method of claim 90, wherein said fluorine is introduced without placing essentially any of said fluorine into said gate dielectric.

92. The method of claim 90, wherein said fluorine is introduced by implantation of ions of atoms.

93. The method of claim 90, wherein said fluorine is introduced by implantation of ions of molecules.

94. The method of claim 90, wherein said semiconductor material is a semiconductor substrate.

95. The method of claim 90, wherein said semiconductor material is a fin of a finFET.

96. The method of claim 90, wherein said fluorine is introduced after introducing said source/drain dopants.

97. The method of claim 90, wherein said fluorine is introduced before introducing said source/drain dopants.

98. The method of claim 24, wherein said anneal process has a temperature of at least about 990° C.

99. The method of claim 24, wherein said anneal process has a duration of about 5 seconds or less.

100. The method of claim 72, wherein said introducing said source/drain dopants comprises ion implanting said source/drain dopants.

101. The method of claim 90, wherein said introducing said source/drain dopants comprises ion implanting said source/drain dopants.

102. The method of claim 72, wherein said anneal process is a rapid thermal anneal process.

103. The method of claim 90, wherein said anneal process is a rapid thermal anneal process.

104. The method of claim 90, wherein there is no additional anneal process performed between introducing said source/drain dopants and introducing said fluorine.

105. The method of claim 90, wherein the fluorine is introduced only into the gate electrode and not said semiconductor material.

* * * * *